US011229144B2

United States Patent
Weng et al.

(10) Patent No.: US 11,229,144 B2
(45) Date of Patent: Jan. 18, 2022

(54) HEAT DISSIPATION HOUSING, MANUFACTURING METHOD THEREOF AND ELECTRONIC DEVICE USING THE SAME

(71) Applicant: Sercomm Corporation, Taipei (TW)

(72) Inventors: Shi-Jun Weng, Suzhou (CN); Cheng-Chung Chang, Taipei (TW)

(73) Assignee: SERCOMM CORPORATION, Taipei (TW)

( * ) Notice: Subject to any disclaimer, the term of this patent is extended or adjusted under 35 U.S.C. 154(b) by 0 days.

(21) Appl. No.: 16/899,724

(22) Filed: Jun. 12, 2020

(65) Prior Publication Data
US 2020/0413569 A1    Dec. 31, 2020

(30) Foreign Application Priority Data

Jun. 25, 2019   (CN) .......................... 201910553464.8

(51) Int. Cl.
     *H05K 7/20*      (2006.01)
     *H01L 23/367*      (2006.01)
     *H05K 1/02*      (2006.01)

(52) U.S. Cl.
     CPC ..... *H05K 7/20436* (2013.01); *H05K 7/20445* (2013.01); *H01L 23/3675* (2013.01); *H05K 1/0203* (2013.01)

(58) Field of Classification Search
     CPC ........... H05K 7/20436; H05K 7/20445; H05K 7/20454; H05K 7/20472; H05K 7/20481;
(Continued)

(56) References Cited

U.S. PATENT DOCUMENTS 4,673,363 A    6/1987   Hudson et al.
4,800,956 A *   1/1989   Hamburgen ........ H01L 23/4338
                                               165/185

(Continued)

FOREIGN PATENT DOCUMENTS

CN      200969729 Y     10/2007
CN      203934232 U     11/2014
(Continued)

OTHER PUBLICATIONS

CN Office Action dated Jan. 22, 2020 in corresponding Chinese application (No. 201910553464.8).

*Primary Examiner* — Zachary Pape
(74) *Attorney, Agent, or Firm* — McClure, Qualey & Rodack, LLP

(57) ABSTRACT

A heat dissipation housing includes an outer casing and the heat conduction block. The heat dissipation housing includes a thickness portion and at least one first tenon extending towards the inner direction of the outer casing from the inner surface of the thickness portion. Heat conduction block includes a base and at least one second tenon extending towards the outer direction of the outer casing from the base. The first tenon and the second tenon are combined, such that the first tenon, the second tenon, and the base together form a column extending towards the inner direction of the outer casing from the inner surface of the thickness portion. The outer casing and the heat conduction block both have a thermal conductivity greater than 0.5 W/m-k.

17 Claims, 8 Drawing Sheets

(58) Field of Classification Search
CPC .............. H05K 1/0203; H01L 23/3672; H01L 23/3675
USPC .......................................... 361/709, 710, 719
See application file for complete search history.

(56) References Cited

U.S. PATENT DOCUMENTS

| | | | | |
|---|---|---|---|---|
| 5,515,912 | A * | 5/1996 | Daikoku | H01L 23/4338 165/185 |
| 5,774,334 | A * | 6/1998 | Kawamura | H01L 23/4338 165/80.4 |
| 5,787,976 | A * | 8/1998 | Hamburgen | F28F 3/02 165/185 |
| 6,180,436 | B1 * | 1/2001 | Koors | H01L 23/3675 257/E23.104 |
| 7,102,285 | B2 * | 9/2006 | Chen | B82Y 10/00 313/46 |
| 7,821,125 | B2 * | 10/2010 | Tokita | H01L 23/053 257/711 |
| 8,957,752 | B2 * | 2/2015 | Sharma | H01F 27/02 336/90 |
| 9,609,786 | B2 * | 3/2017 | Lee | H05K 7/20409 |
| 9,901,009 | B2 * | 2/2018 | Sugita | G06F 1/20 |
| 10,231,355 | B2 | 3/2019 | Sasaki | |
| 2017/0273218 | A1 * | 9/2017 | Stoermer | H01L 23/433 |
| 2018/0270963 | A1 | 9/2018 | Sohn | |
| 2019/0083700 | A1 | 3/2019 | Lee | |

FOREIGN PATENT DOCUMENTS

| | | |
|---|---|---|
| CN | 104703446 A | 6/2015 |
| CN | 204534189 U | 8/2015 |
| CN | 105156930 A | 12/2015 |
| CN | 104703446 B | 10/2017 |
| CN | 107564870 A | 1/2018 |
| JP | 2004241553 A | 8/2004 |
| JP | 2007073744 A | 3/2007 |

* cited by examiner

HEAT DISSIPATION HOUSING, MANUFACTURING METHOD THEREOF AND ELECTRONIC DEVICE USING THE SAME

This application claims the benefit of People's Republic of China application Serial No. 201910553464.8, filed on Jun. 25, 2019, the subject matter of which is incorporated herein by reference.

TECHNICAL FIELD

The disclosure relates in general to a housing, and more particularly to a heat dissipation housing, a manufacturing method thereof and an electronic device using the same.

BACKGROUND

Due to the consideration of spatial arrangement, it is very difficult for the housing of the electronic device to achieve a uniform distribution of wall-thickness. For example, in order to lean on some elements, the wall-thickness must be increased at some parts of the housing. During the injection molding process of the housing, the fluidic housing material must go through a cooling process before it solidifies. However, since the thickness portion of the housing has different degrees of contraction, contraction problems such as uneven surface, collapsed appearance, hollowed interior may be inevitable.

SUMMARY

The disclosure is directed to a heat dissipation housing, a manufacturing method thereof and an electronic device using the same capable of resolving the existing problems.

According to one embodiment of the present invention, a heat dissipation housing of an electronic device is provided. The heat dissipation housing includes an outer casing and a heat conduction block. The outer casing includes a thickness portion and at least one first tenon, wherein the at least one first tenon is extending towards an inner direction of the outer casing from the inner surface of the thickness portion. Heat conduction block includes a base and at least one second tenon, wherein at least one second tenon is extending towards an outer direction of the outer casing from the base. The at least one first tenon and the at least one second tenon are combined, such that the at least one first tenon, the at least one second tenon and the base together form a column extending towards the inner direction of the outer casing from the inner surface of the thickness portion. The outer casing and the heat conduction block both have a thermal conductivity greater than 0.5 W/m-k.

According to another embodiment of the present invention, an electronic device is provided. The electronic device includes a heat dissipation housing, a heat generating component and a thermal pad. The heat dissipation housing can be realized by the heat dissipation housing disclosed above. The thermal pad is interposed between the base of the heat conduction block and the heat generating component.

According to an alternative embodiment of the present invention, a manufacturing method of a heat dissipation housing of an electronic device is provided. The manufacturing method includes following steps: forming one of an outer casing and a heat conduction block: and forming the other one of the outer casing and the heat conduction block and combining the outer casing and the heat conduction block, wherein the outer casing and the heat conduction block have characteristics disclosed above.

The present invention can resolve the contraction problem faced by existing technologies that the appearance may collapse and the interior may be hollowed due to different degrees of contraction at the inside and the outside of the thickness portion of the housing.

The above and other aspects of the invention will become better understood with regard to the following detailed description of the preferred but non-limiting embodiment (s). The following description is made with reference to the accompanying drawings.

Figure 1A:
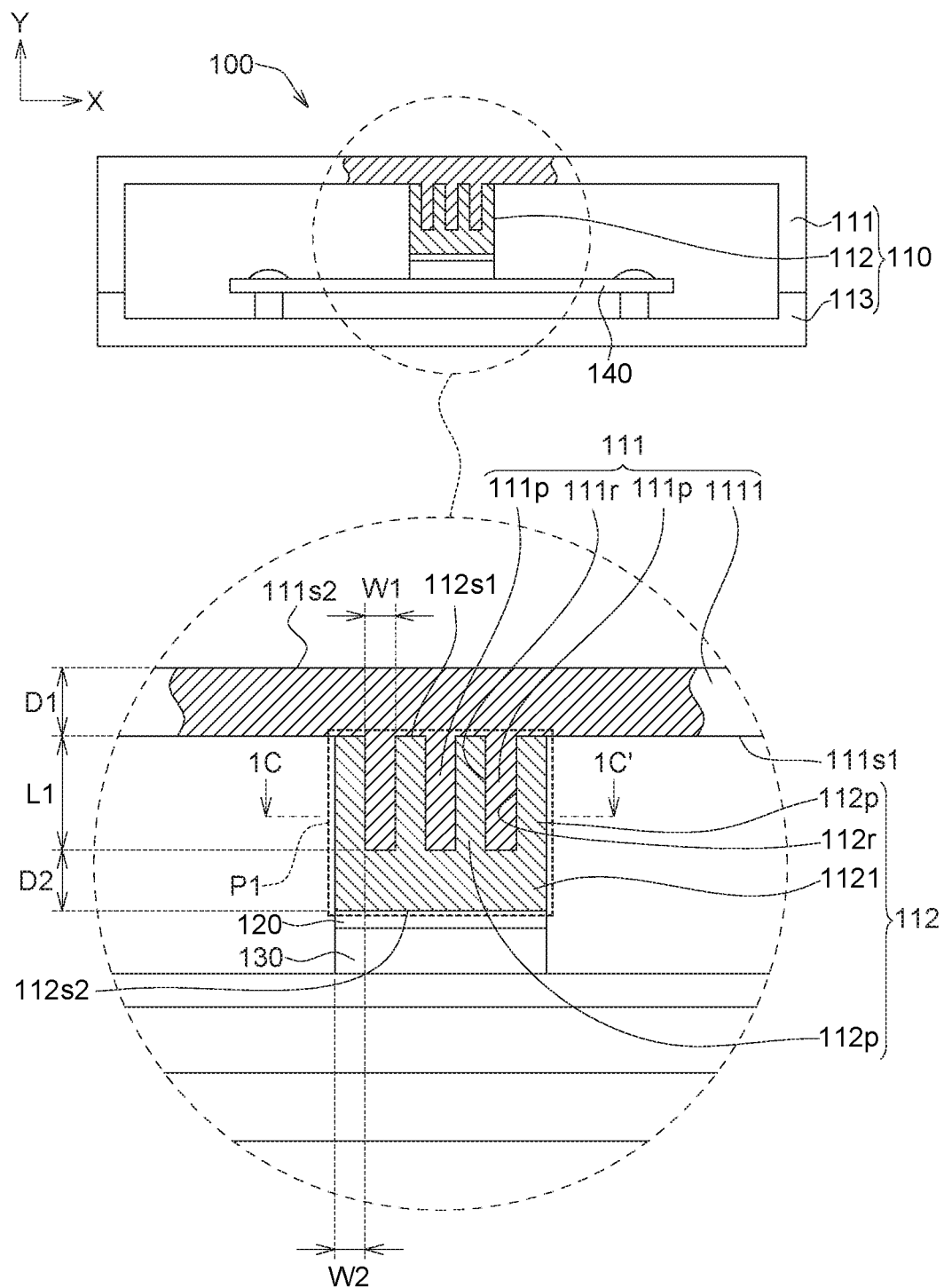
FIG. 1A is a schematic diagram (partial cross-sectional view) of an interior of an electronic device according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
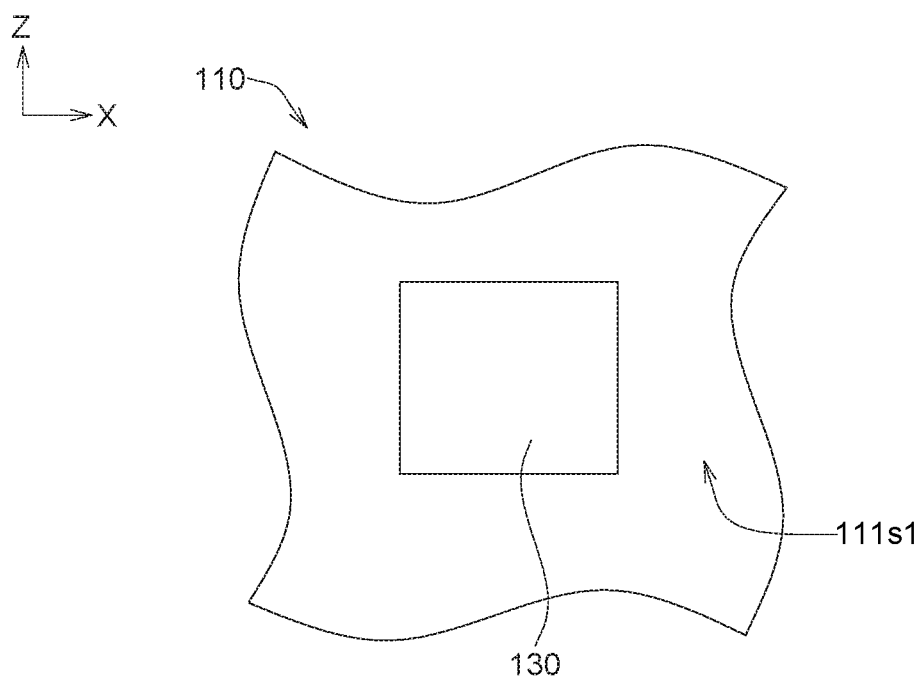
FIG. 1B is a partial schematic diagram of a heat dissipation housing and a heat generating component of the electronic device of FIG. 1A viewed along a direction towards an inner surface.
Figure 1C:
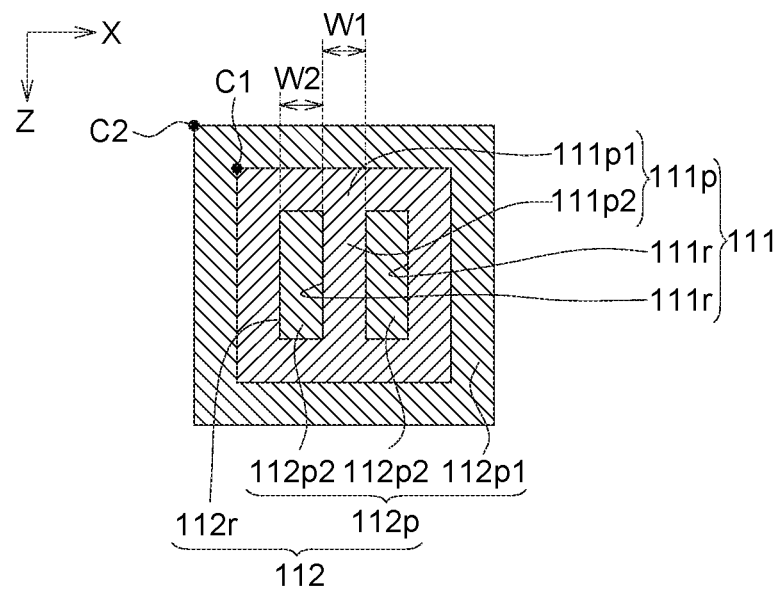
FIG. 1C is a cross-sectional view of the heat dissipation housing of FIG. 1A viewed along a direction 1C-1C', wherein the cross section is parallel to the XZ plane.

Refer to FIG. 1A to FIG. 1C. FIG. 1A is a schematic diagram (partial cross-sectional view) of an interior of an electronic device 100 according to an embodiment of the present invention. FIG. 1B is a partial schematic diagram of a heat dissipation housing 110 and a heat generating component 130 of the electronic device of FIG. 1A viewed along a direction towards an inner surface 111s1 (for example, along +Y direction). FIG. 1C is a cross-sectional view of the heat dissipation housing 110 of FIG. 1A viewed along a direction 1C-1C', wherein the cross section is parallel to the XZ plane.

The electronic device 100 can be, e.g., a home gateway, a wireless access point, a router, or a broadband access device.

The electronic device 100 includes a heat dissipation housing 110, a thermal pad 120, a heat generating component 130 and a printed circuit board 140. The thermal pad 120 is interposed between the heat generating component 130 and the heat dissipation housing 110 and can bond the heat dissipation housing 110 and the heat generating component 130 together. As an example, the thermal pad 120 can be realized by a thermal adhesive such as thermal glue, thermal paste, or thermal tape. The heat generating component 130 is disposed on the printed circuit board 140. The heat generating component 130 can be a central processing unit (CPU), a Wi-Fi chip, a Wi-Fi power amplifier, a DC converter, an audio amplifier, a power management IC (PMIC), a bi-directional optical subassembly (BOSA), a BOSA line driver, a light source, a transistor or other elements which would generate heat during operation. The heat generated by the heat generating component 130 during operation can be transferred to the heat dissipation housing 110 through the thermal pad 120. The heat dissipation housing 110 has a high thermal conductivity, and therefore can quickly dissipate the heat generated by the heat generating component 130 to the exterior. The air ventilation in the exterior can speed up the heat dissipation of the heat.

As indicated in FIG. 1A, the heat dissipation housing 110 includes a set of outer casings 111 and 113 coupled to each other and a heat conduction block 112. In the present embodiment, the outer casing 111 is an upper cover of the electronic device 100, and the outer casing 113 is a lower cover of the electronic device 100.

The outer casing 111 includes a thickness portion 1111 and at least one first tenon 111p. In an embodiment, the thickness portion 1111 and the first tenon 111p could be integrated into one piece. The thickness portion 1111 has an inner surface 111s1 and an outer surface 111s2 disposed oppositely. The first tenon 111p extends towards the inner direction (here, the −Y direction) of the outer casing 111 from the inner surface 111s1, and the gap between every two adjacent first tenons 111p forms a second mortise 111r.

The heat conduction block 112 includes a base 1121 and at least one second tenon 112p. In an embodiment, the base 1121 and the second tenon 112p could be integrated into one piece. The second tenon 112p extends towards the outer direction (here, the +Y direction) of the outer casing 111 from the base 1121, and the gap between every two adjacent second tenons 112p forms a first mortise 112r.

As indicated in FIG. 1A, the first tenon 111p and the second tenon 112p are combined, such that the first tenon 111p, the second tenon 112p, and the base 1121 together form a column P1 extending towards the inner direction (for example, the −Y direction) of the outer casing from the inner surface 111s1 of the thickness portion 111.

As indicated in FIG. 1A, the first tenon 111p is embedded in the first mortise 112r, and the second tenon 112p is embedded in the second mortise 111r In an embodiment, the outer casing 111 and the heat conduction block 112 can be combined by using the secondary injection molding technology or the dual-material injection molding technology, such that the first mortise 112r can be completely or partially filled up by the first tenon 111p, and the second mortise 111r can be completely or partially filled up by the second tenon 112p. In the present embodiment, the first mortise 112r is completely filled up by the material of the first tenon 111p, and the second mortise 111r r is completely filled up by the material of the second tenon 112p, such that the column becomes a solid column without inner gap. Because of the bonding between the outer casing 111 and the heat conduction block 112, the outer casing 111 and the heat conduction block 112 cannot move with respective to each other. In other words, once combined, the relative position of the outer casing 111 and the heat conduction block 112 with respective to each other will not change (or be fixed).

During the injection molding process of the heat dissipation housing 110, the fluidic material of the outer casing and the material of the heat conduction block firstly go through a cooling process and then are solidified as the outer casing 111 and the heat conduction block 112 respectively, wherein the materials contract during the cooling process. In the present embodiment, since the outer casing 111 and the heat conduction block 112 are formed separately, the thickness portion can be separately formed in two processes to reduce or avoid the materials being contracted in a non-uniform manner during the cooling process.

In terms of the outer casing 111 as indicated in FIG. 1A, a number of first tenons 111p are arranged at an interval to improve the problem of non-uniform contraction which occurs when partial thickness of the outer casing 111 is too thick, Similarly, in terms of the heat conduction block 112, the design of the second tenons 112p of the heat conduction block 112 can improve the problem of non-uniform contraction caused by the thickness at parts of the single outer casing 111 being too thick.

Given that the non-uniform contraction is minor in the heat conduction block 112 and that the bottom surface 112s2 of the heat conduction block 112 will not severely collapse and will be relatively even, the thermal pad 120 and the bottom surface 112s2 can have a larger contact area to increase the heat transfer efficiency. Furthermore, given that the non-uniform contraction in the heat dissipation housing 110 is minor and that the outer surface 111s2 of the thickness portion 111 of the outer casing 111 will not severely collapse, the outer surface 111s2 will be relatively flat or even.

Normally, the thermal conductivity of the plastic housing is smaller than 0.2 W/m-k. In the present embodiment, the outer casing 111 and the heat conduction block 112 both have a thermal conductivity greater than 0.5 W/m-k, for example, in a range of 0.5 W/m-k to 60 W/m-k, and therefore can quickly dissipate the heat generated by the heat generating component 130 to the exterior. In the present embodiment, the outer surface 111s2 of the outer casing 111 is not covered by any physical element and can directly contact the air, therefore the outer surface 111s2 can quickly dissipate the heat generated by the heat generating component 130 to the exterior of the heat dissipation housing 110.

The outer casing 111 and/or the heat conduction block 112 can be formed by a polymer, for example, a thermal plastic whose thermal conductivity is greater than 0.5 W/m-k. For example, in an embodiment, the outer casing 111 and/or the heat conduction block 112 can use polycarbonate (PC), acrylonitrile butadiene styrene (ABS), polypropylene (PP), polyimide (PA), liquid crystal polyester resin (LOP), polyphenylene sulfide (PPS) or a combination thereof as a base material, and can further add a material with high thermal conductivity, for example, graphite, ceramic powder, metal oxide, thermally conductive powder or graphene, to the base. In addition, the outer casing 111 and the heat conduction block 112 can be formed of the same material, or can be formed of different materials as long as the materials can be chemically or physically bonded together.

To summarize, the heat dissipation housing 110 has superior thermal conductivity, and therefore can replace the heat dissipation function of metal housing. Additionally, the heat dissipation housing 110 has an insulation property, and therefore less affects the wireless communication of the electronic device 100.

As indicated in FIG. 1A, the thickness portion 1111 of the outer casing 111 has a first thickness D1, and the first tenon 111p has a first width W1 smaller than or equal to a half of the first thickness D1. Through such design, the problem of non-uniform contraction during the cooling stage of the material can be effectively reduced or can even be avoided. In an embodiment, the first thickness D1 can be in a range of 1 to 3 millimeters, and the first width W1 is substantially equal to or greater than 0.6 millimeters, such that the formability of the first tenon 111p during the injection molding process can be assured (the fluidic tenon material can smoothly fill up the first mortise 112r to form the first tenon 111p).

As indicated in FIG. 1A, the base 1121 of the heat conduction block 112 has a second thickness D2, and each second tenon 112p has a second width W2 smaller than or equal to a half of the second thickness D2. Through such design, the problem of non-uniform contraction during the cooling stage of the material can be effectively reduced or even be avoided.

As indicated in FIG. 1A, the second tenon 112p of the heat conduction block 112 is protruded towards the inner surface 111s1 by a protrusion height L1 equal to or greater than 3 millimeters. Thus, during the process of forming the heat conduction block 112, it can be assured that the fluidic tenon material can smoothly fill up the second mortise 111r to form the second tenon 112p.

In the embodiments of the present invention, the tenon of the heat dissipation housing 110 can have different geometric shapes. In view of FIG. 1C, the first tenons 111p of the outer casing 111 include a squared tenons 111p1 and a strip tenon 111p2, wherein the two ends of the strip tenon 111p2 are connected to the squared tenon 111p1, and are surrounded by the squared tenon 111p1. Two second mortises 111r are formed between the squared tenon 111p1 and the strip tenon 111p2. The second tenons 112p of the heat conduction block 112 include a squared tenon 112p1 and two strip tenons 112p2, and a first mortise 112r is formed between the squared tenon 112p1 and the strip tenon 112p2. As indicated in the diagram, the second mortises 111r are completely filled up by the strip tenons 112p2, and the first mortise 112r is completely filled up by the first tenon 111p, In view of FIG. 1C, the first tenon 111p and the second tenon 112p form a complementary structure. That is, the cross-sectional region is either filled up by the first tenon 111p or the second tenon 112p.

In another embodiment, the corner C1 of the first tenon 111p and/or the corner C2 of the second tenon 112p both can be less sharp, e.g., be round, to reduce the concentration of thermal stress. As indicated in FIG. 1C, the outer edges of the second tenon 112p form a polygon, such as a square. Alternatively, it can also form a rectangle, a circle or an ellipse.

Figure 2:
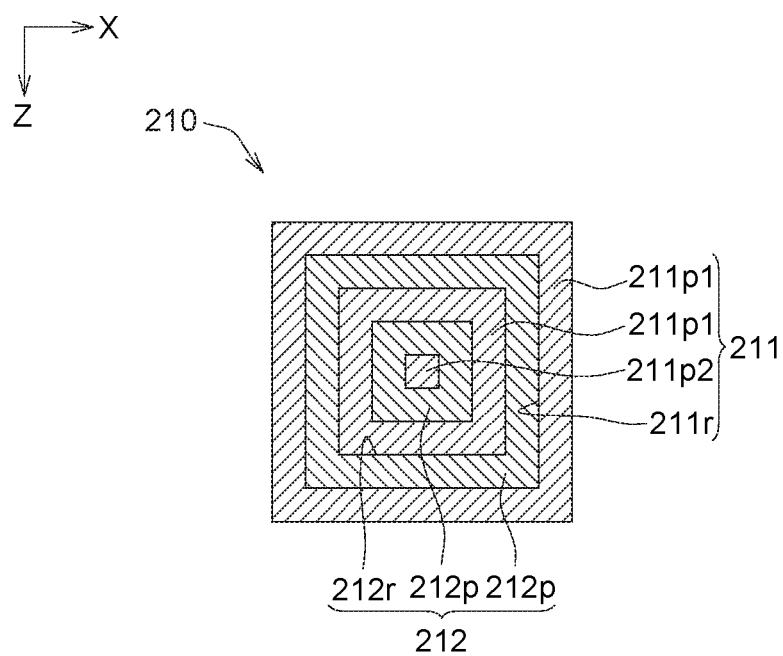
FIGS. 2 to 4 are partial cross-sectional views of the junction between an outer casing and a heat conduction block of the heat dissipation housing according to other embodiments of the present invention.
Figure 3:
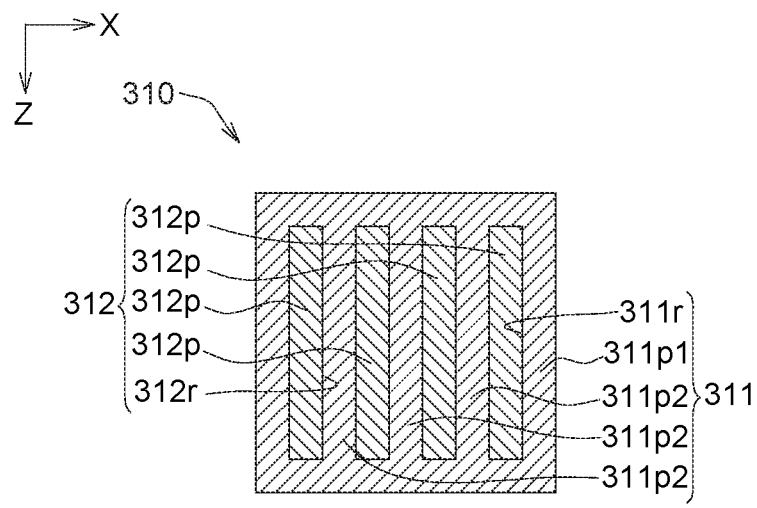
Figure 4:
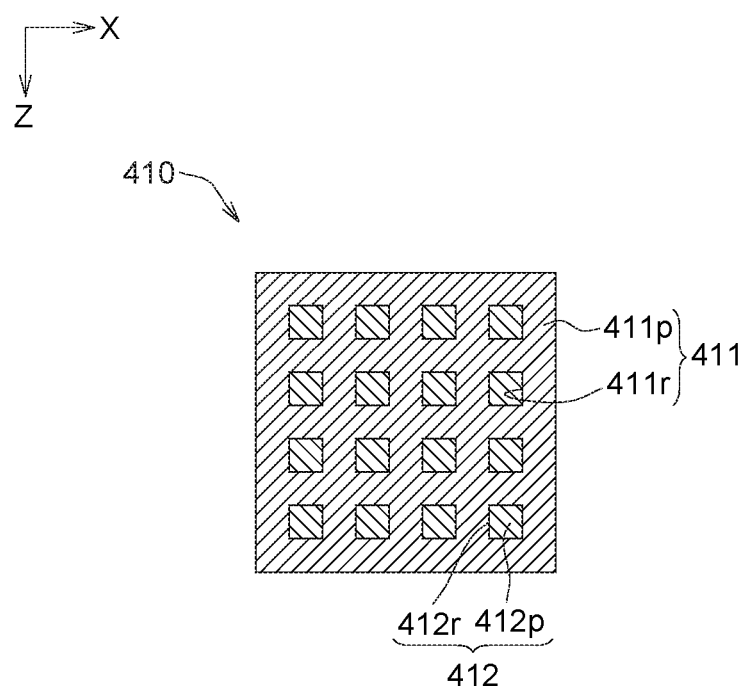

Referring to FIGS. 2 to 4, partial cross-sectional views of the junction between an outer casing and a heat conduction block of the heat dissipation housing according to other embodiments of the present invention are shown. The heat dissipation housing 110 of the electronic device 100 of FIG. 1A can be replaced by the heat dissipation housing 210 of FIG. 2, the heat dissipation housing 310 of FIG. 3 or the heat dissipation housing 410 of FIG. 4. These heat dissipation housings are different only at the partial cross-sectional view of the junction between the outer casing and the heat conduction block, and are basically identical in other features.

As indicated in FIG. 2, the heat dissipation housing 210 includes an outer casing 211 and a heat conduction block 212. In view of FIG. 2, the first tenons of the outer casing 211 include a number of squared tenons 211p1 and a block tenon 211p2, wherein the squared tenons 211p1 are separated from each other and surround the block tenon 211p2, and a second mortise 211r is formed between the squared tenons 211p1 and the block tenon 211p2. The second tenons 212p of the heat conduction block 212 are squared tenons, and a first mortise 212r is formed between every two adjacent second tenons 212p. As indicated in the diagram, the second mortise 211r is completely filled up by the second tenon 212p, and the first mortise 212r is completely filled up by the squared tenon 211p1 and the block tenon 211p2, Additionally, the cross-section of the block tenon 211p2 is polygonal, and can also be round or oval.

As indicated in FIG. 3, the heat dissipation housing 310 includes an outer casing 311 and a heat conduction block 312. In view of FIG. 3, the first tenons of the outer casing 311 include a squared tenon 311p1 and a number of strip tenons 311p2, wherein the strip tenons 311p2 are separated from each other and are surrounded by the squared tenon 311p1, and a second mortise 311r is formed between the squared tenon 311p1 and the strip tenons 311p2. The second tenons 312p of the heat conduction block 312 are strip tenons, and a first mortise 312r is formed between every two adjacent second tenons 312p. As indicated in the diagram, the second mortise 311r is completely filled up by the second tenon 312p, and the first mortise 312r is completely filled up by the squared tenon 311p1 and the strip tenon 311p2.

As indicated in FIG. 4, the heat dissipation housing 410 includes an outer casing 411 and a heat conduction block 412. In view of FIG. 4, the first tenon 411p of the outer casing 411 is a grid structure, and each grid forms a second mortise 411r. The second tenons 412p of the heat conduction block 412 are block tenons, and a first mortise 412r is formed between every two adjacent second tenons 412p. As indicated in the diagram, the second mortise 411r is completely filled up by the second tenon 412p, and the first mortise 412r is completely filled up by the first tenon 411p.

Figure 5A:
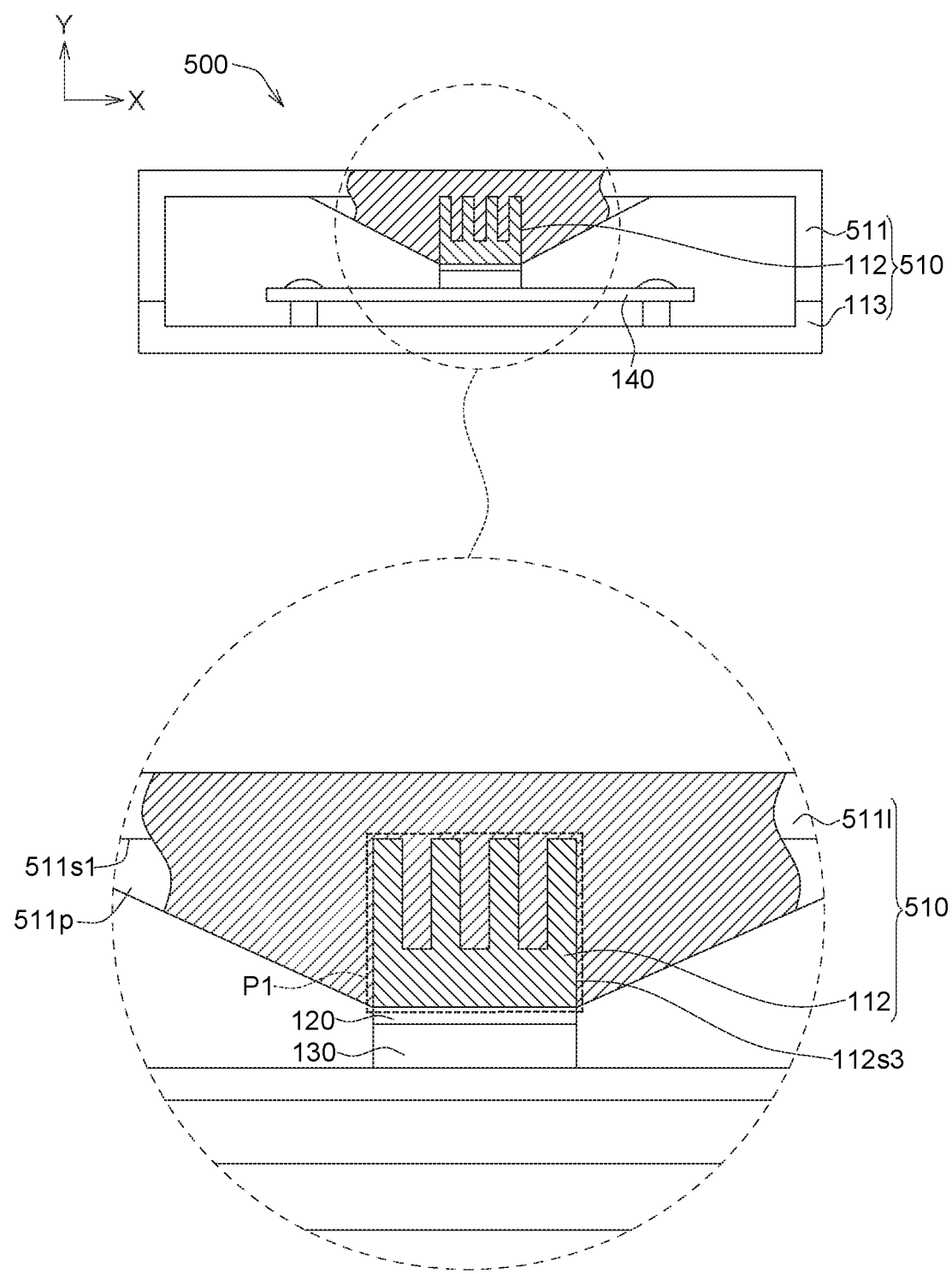
FIG. 5A is a schematic diagram (partial cross-sectional view) of the interior of an electronic device according to an embodiment of the present invention.
Figure 5B:
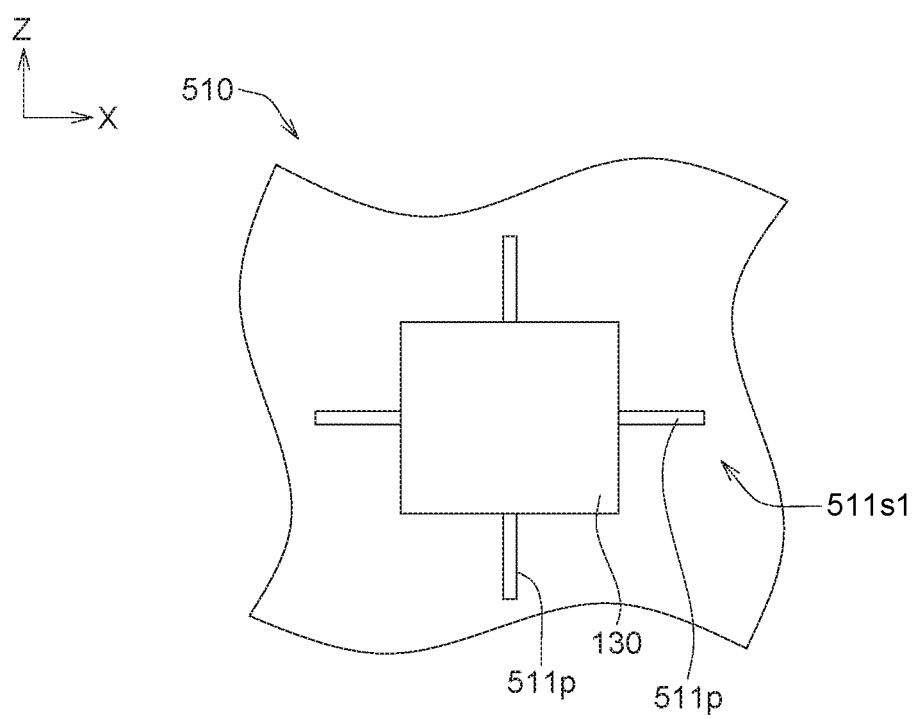
FIG. 5B is a partial schematic diagram of a heat dissipation housing and a heat generating component of the electronic device of FIG. 5A viewed along a direction towards an inner surface.

Refer to FIG. 5A and FIG. 5B. FIG. 5A is a schematic diagram (partial cross-sectional view) of the interior of an electronic device 500 according to an embodiment of the present invention. FIG. 5B is a partial schematic diagram of a heat dissipation housing 510 and a heat generating component 130 of the electronic device 500 of FIG. 5A viewed along a direction (for example, +Y direction) towards an inner surface 511s1. The outer casing 511 of the present embodiment is different from the outer casing 111 of previous embodiments in that, the outer casing 511 further includes at least one rib 511p extending to the inner surface 511s1 of the thickness portion 5111 of the outer casing 511 from the lateral surface 112s3 of the heat conduction block 112 (or a lateral surface of the column P). The rib 511p can form a part of the outer casing 511 or a part of the heat conduction block 112.

The rib 511p can enhance the strength of the outer casing 511. The heat dissipation housing 510 of the present embodiment has superior thermal conductivity and strength, and is able to replace metal housing. Additionally, the heat dissipation housing 510 has insulation property, and is less likely to affect the wireless communication of the electronic device 500.

Figure 6A:
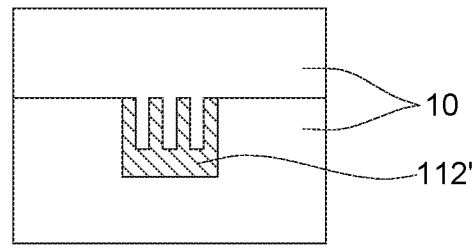
FIGS. 6A to 6C are diagrams of the manufacturing process of the heat dissipation housing of the electronic device of FIG. 1A.
Figure 6B:
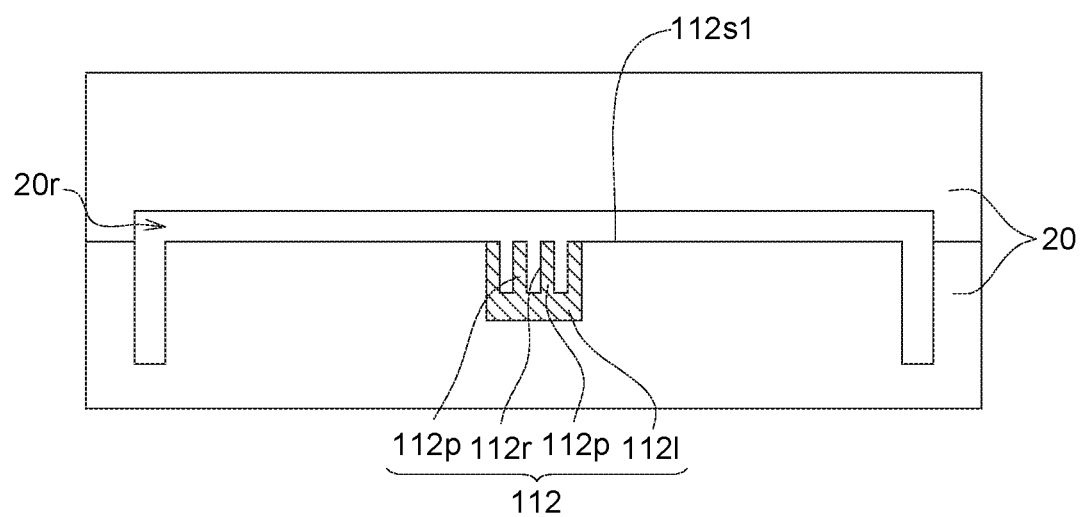
Figure 6C:
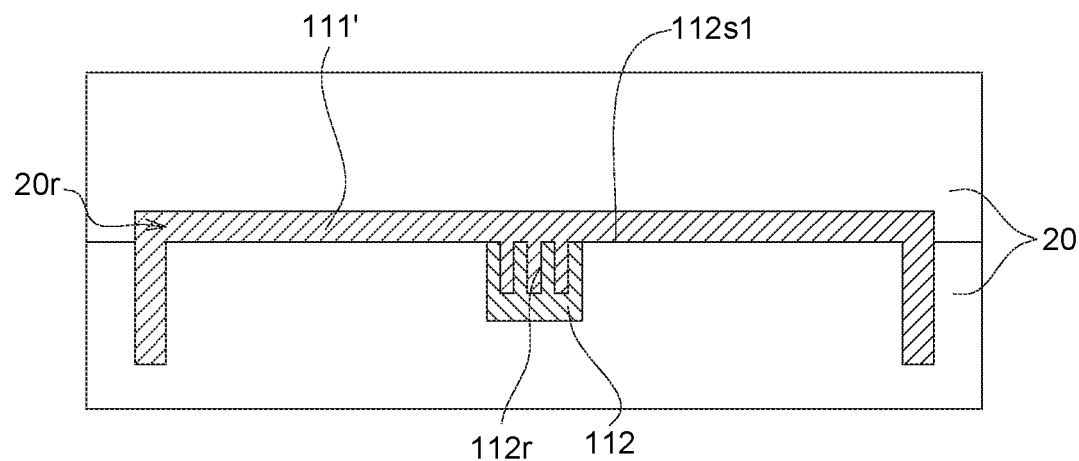

Referring to FIGS. 6A to 6C, diagrams of the manufacturing process of the heat dissipation housing 110 are shown. The outer casing 111 and the heat conduction block 112 of the heat dissipation housing 110 can be formed by using the secondary injection molding technology or the dual-material injection molding technology. FIGS. 6A to 6C are exemplified by the dual-material injection molding technology.

As indicated in FIG. 6A, the mold cave of the mold 10 is filled with the fluidic heat conduction block material 112' by using the injection molding technology. The material of the heat conduction block 112' is cooled and solidified to form the heat conduction block 112 as indicated in FIG. 1A.

As indicated in FIG. 6B, the solidified heat conduction block 112 is placed in the mold cave 20r of another mold 20.

As indicated in FIG. 6C, the mold cave 20r of the mold 20 is filled with the fluidic material of the outer casing 111' by using the injection molding technology. The outer fluidic casing material 111' flows to the first mortise 112r of the heat conduction block and fills up the first mortise 112r. The outer casing material 111' is cooled and then is solidified to form the outer casing 111 as indicated in FIG. 1A.

It can be understood from FIGS. 6A to 6C that the heat conduction block 112 and the outer casing 111 are separately formed, therefore the thickness portion can be respectively formed in two processes (as indicated in FIG. 6A and FIG. 6C), such that the problem of non-uniform contraction during the cooling stage of the material can be avoided.

Figure 6D:
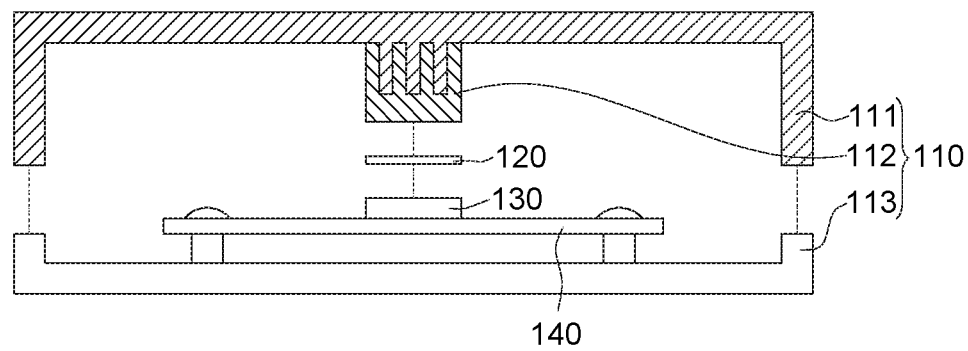
FIG. 6D is a diagram of the manufacturing process of the electronic device of FIG. 1A.

Then, as indicated in FIG. 6D, the thermal pad 120 is interposed between the heat conduction block 112 of the heat dissipation housing 110 and the heat generating component 130 to form the electronic device 100 as indicated in FIG. 1A.

In another embodiment, the outer casing 111 can be formed firstly, and then the heat conduction block 112 is formed and combined with the outer casing 111 to form the heat dissipation housing 110.

In addition, the manufacturing methods of the heat dissipation housings 210, 310, 410 and 510 are similar or identical to the manufacturing method of the heat dissipation housing 110, and the similarities are not repeated here. The manufacturing method of the electronic device 500 is similar or identical to the manufacturing method of the electronic device 100, and the similarities are not repeated here.

Although the present invention is disclosed with a number of embodiments, it should be noted that these embodiments are not for limiting the present invention.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A heat dissipation housing of an electronic device, comprises:
    an outer casing, comprising a thickness portion and at least one first tenon extending towards an inner direction of the outer casing from an inner surface of the thickness portion; and
    a heat conduction block, comprising a base and at least one second tenon extending towards an outer direction of the outer casing from the base;
    wherein the at least one first tenon and the at least one second tenon are combined, such that the at least one first tenon, the at least one second tenon and the base together form a column extending towards the inner direction of the outer casing from the inner surface of the thickness portion; and the outer casing and the heat conduction block both have a thermal conductivity greater than 0.5 W/m-k;
    wherein the heat dissipation housing has electrical insulation property;
    wherein the at least one second tenon encapsulates and contacts the whole lateral surface of each of the at least one first tenon, or the at least one first tenon encapsulates and contacts the whole lateral surface of each of the at least one second tenon.

2. The heat dissipation housing according to claim 1, wherein the column is a solid column.

3. The heat dissipation housing according to claim 1, wherein the thickness portion has a first thickness; the at least one first tenon has a first width smaller than or equal to a half of the first thickness; the base has a second thickness; and the second tenon has a second width smaller than or equal to a half of the second thickness.

4. The heat dissipation housing according to claim 1, wherein the outer casing and the heat conduction block are formed by using secondary injection molding technology or dual-material injection molding technology; and the outer casing and the heat conduction block both are formed of thermal conductive plastic whose thermal conductivity is greater than 0.5 W/m-k.

5. The heat dissipation housing according to claim 1, wherein the outer casing or the heat conduction block further comprises:
    at least one rib extending to a lateral surface of the column from the inner surface of the thickness portion.

6. The heat dissipation housing according to claim 1, wherein the thickness portion and the at least one first tenon are integrated into one piece.

7. The heat dissipation housing according to claim 1, wherein the base and the at least one second tenon are integrated into one piece.

8. An electronic device, comprises:
    the heat dissipation housing according to claim 1;
    a heat generating component; and
    a thermal pad interposed between the base of the heat conduction block and the heat generating component.

9. The electronic device according to claim 8, wherein the column is a solid column.

10. The electronic device according to claim 8, wherein the thickness portion has a first thickness; the at least one first tenon has a first width smaller than or equal to a half of the first thickness; the base has a second thickness; and the second tenon has a second width smaller than or equal to a half of the second thickness.

11. The electronic device according to claim 8, wherein the outer casing and the heat conduction block are formed by using secondary injection molding technology or dual-material injection molding technology; and the outer casing and the heat conduction block both are formed of thermal conductive plastic whose thermal conductivity is greater than 0.5 W/m-k.

12. The electronic device according to claim 8, wherein the outer casing or the heat conduction block further comprises:
    at least one rib extending to a lateral surface of the column from the inner surface of the thickness portion.

13. The electronic device according to claim 8, wherein the thickness portion and the at least one first tenon are integrated into one piece.

14. The electronic device according to claim 8, wherein the base and the at least one second tenon are integrated into one piece.

15. A manufacturing method of a heat dissipation housing of an electronic device, wherein the manufacturing method comprises:
    forming one of an outer casing and a heat conduction block; and forming the other one of the outer casing and the heat conduction block and combining the outer casing and the heat conduction block, wherein the outer casing comprises a thickness portion and at least one first tenon extending towards the inner direction of the outer casing from the inner surface of the thickness portion; the heat conduction block comprises a base and at least one second tenon extending towards the outer direction of the outer casing from the base; the at least one first tenon and the at least one second tenon are combined, such that the at least one first tenon, the at least one second tenon and the base together form a column extending towards the inner direction of the outer casing from the inner surface of the thickness portion; and the outer casing and the heat conduction block both have a thermal conductivity greater than 0.5 W/m-k;
wherein the heat dissipation housing has electrical insulation property;
wherein the at least one second tenon encapsulates and contacts the whole lateral surface of each of the at least one first tenon, or the at least one first tenon encapsulates and contacts the whole lateral surface of each of the at least one second tenon.

16. The manufacturing method according to claim 15, wherein the step of forming one of the outer casing and the heat conduction block and the step of forming the other one of the outer casing and the heat conduction block and combining the outer casing and the heat conduction block are performed by using the secondary injection molding technology or the dual-material injection molding technology.

17. The manufacturing method according to claim 15, wherein the column is a solid column.

* * * * *